(12) United States Patent
Wu et al.

(10) Patent No.: US 12,482,992 B2
(45) Date of Patent: Nov. 25, 2025

(54) POWER ADAPTER

(71) Applicant: Huawei Digital Power Technologies Co., Ltd., Shenzhen (CN)

(72) Inventors: Chenglong Wu, Dongguan (CN); Yujia Wang, Dongguan (CN); Guohua Fan, Dongguan (CN); Zhi Zeng, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 493 days.

(21) Appl. No.: 18/155,884

(22) Filed: Jan. 18, 2023

(65) Prior Publication Data

US 2023/0246400 A1 Aug. 3, 2023

(30) Foreign Application Priority Data

Jan. 29, 2022 (CN) .......................... 202210112369.6

(51) Int. Cl.
| | |
|---|---|
| *H01R 24/28* | (2011.01) |
| *H01R 13/52* | (2006.01) |
| *H01R 13/66* | (2006.01) |
| *H05K 7/20* | (2006.01) |
| *H01R 103/00* | (2006.01) |

(52) U.S. Cl.
CPC ..... *H01R 13/6675* (2013.01); *H01R 13/5202* (2013.01); *H01R 24/28* (2013.01); *H05K 7/20218* (2013.01); *H01R 2103/00* (2013.01)

(58) Field of Classification Search
None
See application file for complete search history.

(56) References Cited

U.S. PATENT DOCUMENTS

| | | | |
|---|---|---|---|
| 9,236,699 B2* | 1/2016 | Lai ........................ | H01R 13/665 |
| 9,343,850 B2* | 5/2016 | Colahan ................ | H02M 7/003 |
| 9,660,391 B1* | 5/2017 | Kim ..................... | H01R 13/502 |
| 2017/0094842 A1 | 3/2017 | Standing | |

FOREIGN PATENT DOCUMENTS

| | | | | |
|---|---|---|---|---|
| CN | 214900637 U | | 11/2021 | |
| DE | 102020105925 A1 * | | 9/2021 | ......... H05K 7/20872 |

\* cited by examiner

*Primary Examiner* — Tho D Ta
(74) *Attorney, Agent, or Firm* — Maier & Maier, PLLC

(57) ABSTRACT

A power adapter includes a housing body, a rear cover, a circuit board assembly, a first guide connector, a second guide connector, and a thermally conductive liquid. The housing body and the rear cover are connected in a sealed manner and enclose to form an accommodating cavity, the circuit board assembly is disposed in the accommodating cavity, the thermally conductive liquid fills the accommodating cavity and wraps the circuit board assembly, the housing body includes a front end wall disposed opposite to the rear cover, the first guide connector is mounted on the front end wall and connected to the front end wall in a sealed manner, the second guide connector is mounted on the rear cover and is connected to the rear cover in a sealed manner.

10 Claims, 15 Drawing Sheets

POWER ADAPTER

CROSS-REFERENCE TO RELATED APPLICATION

This application claims priority to Chinese Patent Application No. 202210112369.6, filed on Jan. 29, 2022, which is hereby incorporated by reference in its entirety.

TECHNICAL FIELD

The embodiments are related to power adapters.

BACKGROUND

A power adapter is a power supply conversion device for portable electronic devices and electronic and electrical appliances, and is usually used for small electronic products such as a mobile phone and a notebook computer. With the progress of science and technology, users using mobile phones gradually pursue a power adapter with a higher charging speed and a smaller volume. Therefore, high power and miniaturization have become one of key selling points of power adapters in the market, and also become one of core competitiveness of brands.

Due to increasing power and decreasing size of a mobile phone power adapter, an overall power density of the power adapter is greatly improved, and accompanying pain points are gradually obvious. For example, components inside a mobile phone power adapter with a high power generate much more heat than a conventional adapter during operation. Due to a small size, the heat is difficult to dissipate inside the power adapter, a local temperature is excessively high, and a temperature of a housing of the power adapter is then increased. Consequently, customer experience is poor in a use process. Therefore, to resolve a heat dissipation problem of a mobile phone adapter is one of key technologies.

SUMMARY

The embodiments may provide a power adapter with good heat dissipation.

According to a first aspect, a power adapter is provided. The power adapter includes a housing body, a rear cover, a circuit board assembly, a first guide connector, a second guide connector, and a thermally conductive liquid. The housing body has an opening, the rear cover is fastened to the housing body and covers the opening, the housing body and the rear cover are connected in a sealed manner and enclose to form an accommodating cavity, the circuit board assembly is disposed in the accommodating cavity, the thermally conductive liquid fills the accommodating cavity and wraps the circuit board assembly, the housing body includes a front end wall disposed opposite to the rear cover, the first guide connector is mounted on the front end wall and connected to the front end wall in a sealed manner, the second guide connector is mounted on the rear cover and is connected to the rear cover in a sealed manner, and both the first guide connector and the second guide connector are electrically connected to the circuit board assembly.

It may be understood that if two components are connected in a sealed manner, it indicates that there is no gap between the two components after the two components are connected.

It should be noted that when the power adapter is in operation, the circuit board assembly generates heat. A related technology implements even heat distribution in the following three manners. In a first manner, heat generated by the circuit board assembly is dissipated from a high-temperature area to a low-temperature area through air inside the power adapter, so that an even heat distribution effect is achieved inside the power adapter. However, in such manner, a heat dissipation speed is low, and a local temperature is excessively high. Therefore, high-temperature overload protection of components of the circuit board assembly is caused and the components stop operating. In a second manner, a potting adhesive is injected into the power adapter, and is used in place of air as a medium for transferring heat, so that an even heat distribution effect is achieved inside the power adapter. However, the injected potting adhesive can affect electromagnetic compatibility of the components of the circuit board assembly. In a third manner, a thermally conductive white adhesive is applied around the components generating a high temperature of the circuit board assembly, to achieve fastening and thermal conduction effects, increase a heat dissipation area, and transfer heat, so that the components achieve an even heat distribution effect. However, a curing time of the white adhesive is long, and it is difficult to control a dispensing range and easy to pollute the components.

In view of this, the housing body and the rear cover enclose to form the accommodating cavity, the housing body and the rear cover are connected in a sealed manner, the thermally conductive liquid can fill the accommodating cavity and wrap the circuit board assembly, and both the first guide connector and the second guide connector are connected to the housing in a sealed manner to ensure that the thermally conductive liquid does not leak. In this way, heat emitted by the circuit board assembly during operation may be quickly transferred from a high-temperature side to a low-temperature side through the thermally conductive liquid to implement even heat distribution, thereby improving heat dissipation efficiency of the power adapter. Compared with the manner of injecting an adhesive into the power adapter or the manner of applying the thermally conductive white adhesive around the components generating a high temperature, the embodiments may not affect electric performance of the circuit board assembly, ensuring a heat dissipation effect of the power adapter with a high power and a small size. Therefore, the size of the power adapter may be as small as possible when performance permits, thereby improving user experience.

In a possible implementation, the first guide connector includes a first connecting portion, a second connecting portion, and an adapting portion, the front end wall includes a first surface and a second surface disposed opposite to each other, the second surface faces toward the accommodating cavity, the first connecting portion is fastened on the first surface, the second connecting portion is fastened on the second surface and electrically connected to the circuit board assembly, the adapting portion penetrates through the front end wall and is electrically connected to each of the first connecting portion and the second connecting portion, and the adapting portion is connected to the front end wall in a sealed manner to ensure airtightness of the accommodating cavity.

In a possible implementation, the adapting portion is fastened on the front end wall through insert molding. It may be understood that, the adapting portion being fastened on the front end wall through insert molding, on one hand, can ensure a sealing effect between the adapting portion and the front end wall, and on the other hand, improves manufacturing efficiency of a product by omitting a step of mounting the adapting portion on the front end wall. In another embodiment, the adapting portion may alternatively be mounted on the front end wall, and a gap between the adapting portion and the front end wall may be sealed by using a sealing material.

In a possible implementation, the first connecting portion is a pin.

In a possible implementation, the power adapter further includes a front cover, pins are provided on the front cover, the pins penetrate through two opposite surfaces of the front cover, the front cover is fastened on the front end wall, and the pins are connected to the first guide connector. It may be understood that the pins need to be plugged and unplugged in a process of connecting to the external power supply, and a gap occurs between the pins and the front cover under a force during plugging and unplugging of the pins. If the pins are directly fastened on the front end wall of the housing body, a gap occurs between the pins and the front end wall during plugging and unplugging of the pins, and the thermally conductive liquid in the accommodating cavity can leak out through the gap. To avoid leakage of the thermally conductive liquid, the first guide connector is provided on the front end wall and the pins are connected to the first guide connector, that is, the pins are separated from the housing body, so that leakage of the thermally conductive liquid can be avoided even if a gap occurs between the pins and the front cover during plugging and unplugging of the pins.

In a possible implementation, the front end wall includes a sealing groove, and the sealing groove is disposed around the first guide connector. The power adapter further includes a second sealing kit, and the second sealing kit is disposed between the sealing groove and the front cover. It may be understood that the sealing groove is configured to accommodate and fasten the second sealing kit, to ensure that the second sealing kit is stably fastened between the front end wall and the front cover. The second sealing kit is disposed between the sealing groove and the front cover to seal a gap between the front end wall and the front cover. In this embodiment, airtightness of the accommodating cavity is improved through several layers of sealing.

In a possible implementation, the front end wall is provided with a liquid injection hole, through which the thermally conductive liquid is filled into the accommodating cavity. In this embodiment, the liquid injection hole is provided in the front end wall, so that during assembly of the power adapter, the circuit board assembly may be fastened inside the housing body, then the rear cover is fastened to the housing body and sealed with the housing body, and finally, the thermally conductive liquid is filled into the accommodating cavity through the liquid injection hole. Compared with a manner of filling the thermally conductive liquid into the accommodating cavity before the rear cover is fastened to the housing body, the operation in this embodiment is more convenient, and the thermally conductive liquid can be more fully filled into the accommodating cavity, thereby achieving a better heat dissipation effect.

In a possible implementation, the power adapter further includes a sealing cap, and the sealing cap is fastened to the liquid injection hole, to prevent the thermally conductive liquid filled into the accommodating cavity from overflowing from the liquid injection hole, thereby ensuring airtightness of the accommodating cavity.

In a possible implementation, the power adapter further includes a front cover, and the front cover is fastened on the front end wall. A surface that is of the sealing cap and that faces away from the liquid injection hole abuts against the front cover. In other words, the cover body also has a position limiting effect on the sealing cap, to prevent the sealing cap from loosening from the liquid injection hole and an exhaust hole and ensure airtightness of the accommodating cavity.

In a possible implementation, the power adapter further includes an exhaust hole, and the exhaust hole is provided in the front end wall and is connected to the accommodating cavity. According to this embodiment, the exhaust hole is provided, so that when the thermally conductive liquid is filled through the liquid injection hole into the accommodating cavity, air in the accommodating cavity may be discharged from the exhaust hole in time. In this way, a speed of filling the thermally conductive liquid into the accommodating cavity is not hindered, efficient filling of the thermally conductive liquid is implemented, and manufacturing efficiency of a product is improved.

In a possible implementation, the power adapter further includes a third sealing kit, the rear cover is provided with an insertion hole, the second guide connector is fastened to the insertion hole, and the second guide connector and a hole wall of the insertion hole are sealed by using the third sealing kit, to prevent the thermally conductive liquid in the accommodating cavity from leaking out from a gap between the second guide connector and the insertion hole, thereby ensuring airtightness of the accommodating cavity.

BRIEF DESCRIPTION OF THE DRAWINGS

To describe the embodiments or the background more clearly, the following describes the accompanying drawings.

DETAILED DESCRIPTION OF THE EMBODIMENTS

The following describes the embodiments with reference to the accompanying drawings.

In descriptions of the embodiments, it should be noted that, unless otherwise clearly specified and limited, terms "mounting" and "connection" should be understood in a broad sense. For example, "connection" may a detachable connection or a non-detachable connection, or may be a direct connection or an indirect connection via an intermediate medium. "Fixed connection" refers to mutual connection and relative positions remain unchanged after the connection. Orientation terms mentioned in the embodiments, such as, "front", "rear", "inside", and "outside", are merely orientations with reference to the accompanying drawings. Therefore, the orientation terms are used to better and more clearly describe and understand the embodiments, rather than to indicate or imply that an apparatus or a component needs to have an orientation or be constructed and operated in an orientation. Therefore, these orientation terms cannot be construed as a limitation on the embodiments. "A plurality of" means at least two.

It may be understood that the embodiments described herein are merely intended to explain related embodiments, rather than to limit the embodiments. It should be further noted that, for convenience of description, only parts related to the embodiments are shown in the accompanying drawings.

Figure 1:
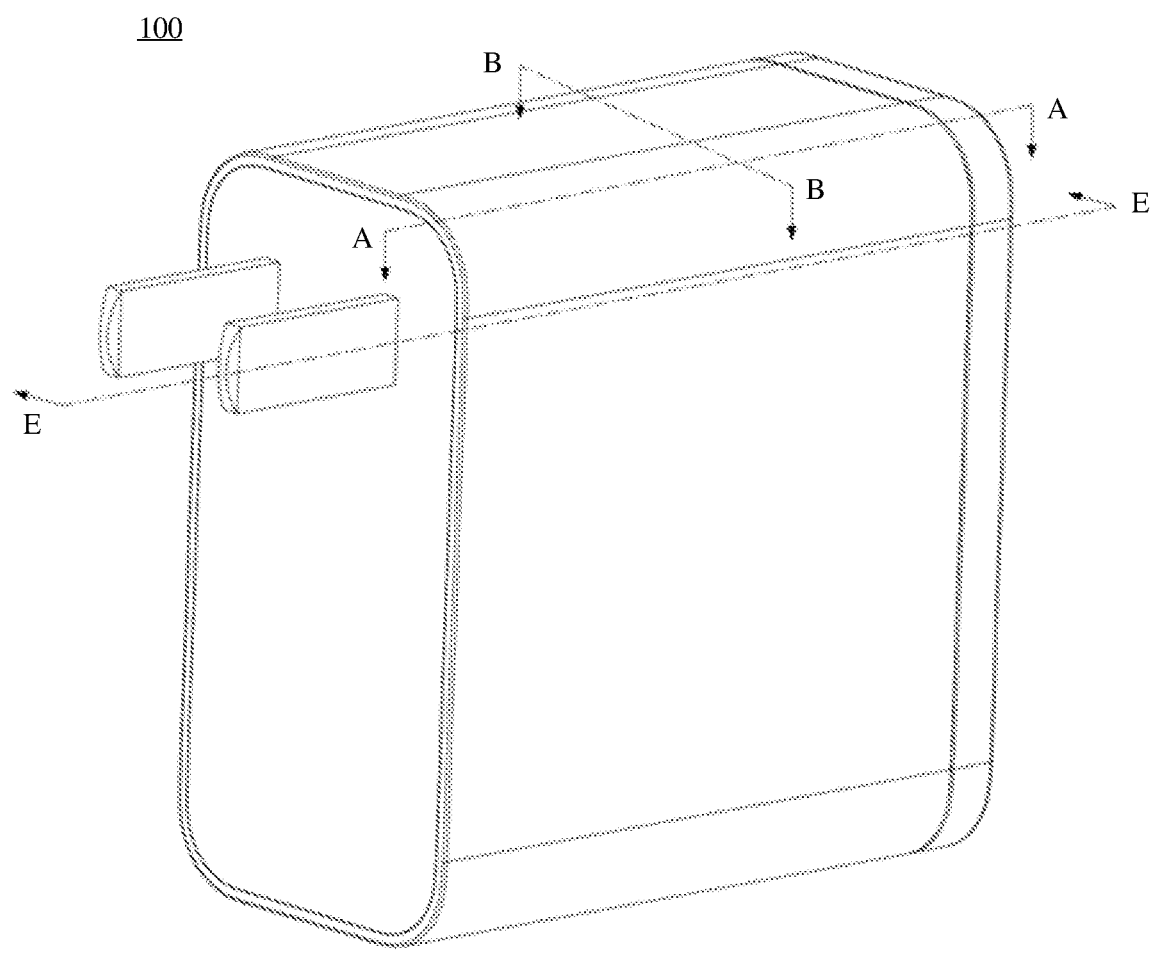
FIG. 1 is a schematic diagram of a structure of a power adapter according to an embodiment.

FIG. 1 is a schematic diagram of a structure of a power adapter 100 according to an embodiment.

An embodiment may provide a power adapter 100. The power adapter 100 may be an adapter for various electronic devices and electronic and electrical appliances, may be a consumer electronic product, or may be another device for a server or a data center. The power adapter 100 may include, but is not limited to, a mobile phone power adapter, an iPad power adapter, a power adapter for a notebook/gaming laptop, a car charger, or the like. The power adapter 100 being a mobile phone power adapter is used as an example in FIG. 1 for description.

Figure 2:
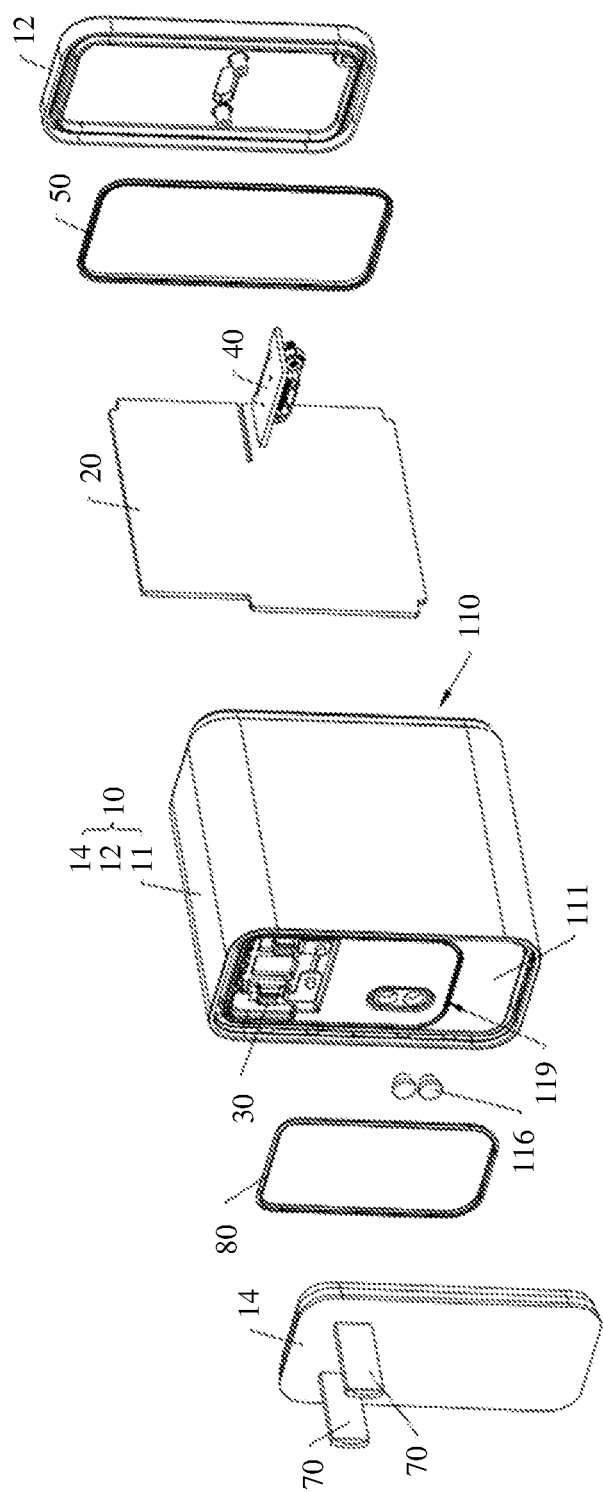
FIG. 2 is a schematic exploded diagram of a power adapter shown in FIG. 1.
Figure 3:
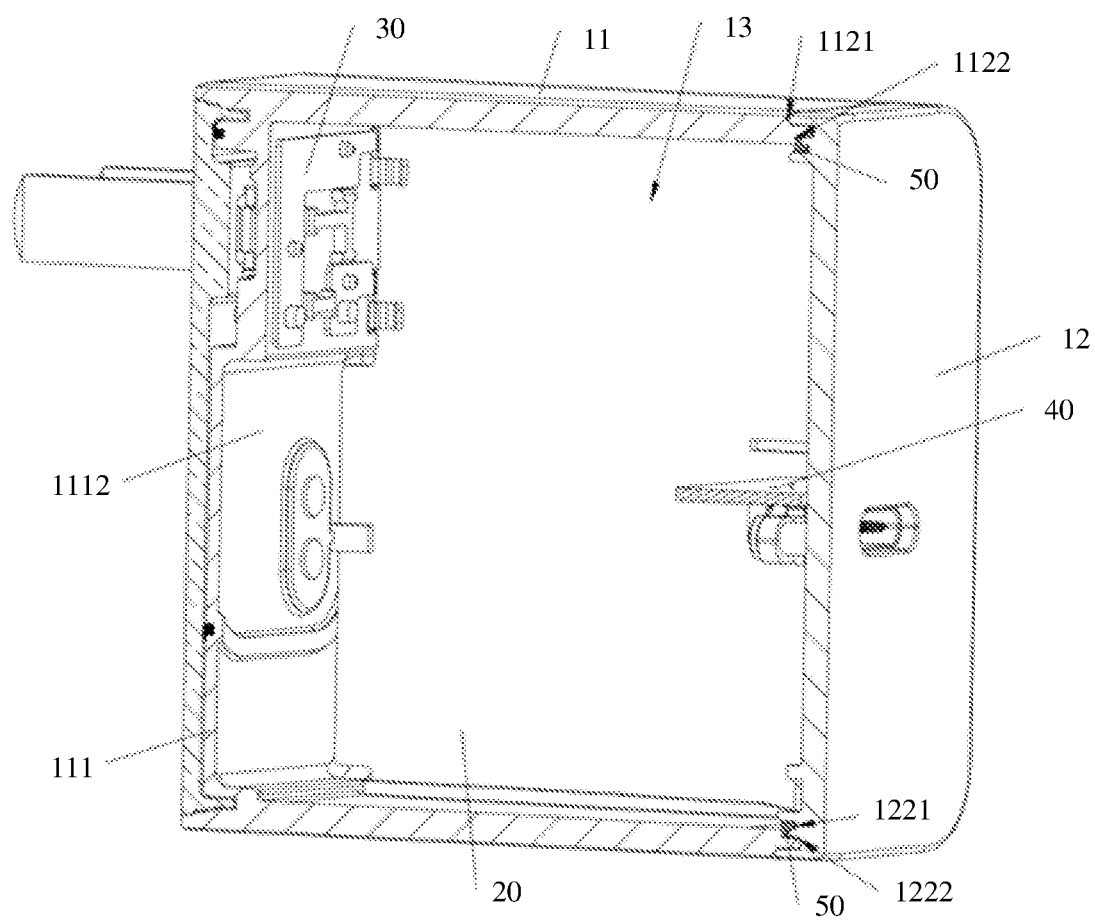
FIG. 3 is a schematic diagram of a cross-sectional structure, in A-A direction, of a power adapter shown in FIG. 1.

FIG. 2 is a schematic exploded diagram of the power adapter 100 shown in FIG. 1. FIG. 3 is a schematic diagram of a cross-sectional structure, in A-A direction, of the power adapter 100 shown in FIG. 1.

The power adapter 100 may include a housing 10, a circuit board assembly 20, a first guide connector 30, a second guide connector 40, a first sealing kit 50, and a thermally conductive liquid (which is not shown in the figure). The housing 10 may include a housing body 11 and a rear cover 12, where the housing body 11 has an opening 110, the rear cover 12 is fastened to the housing body 11 and covers the opening 110, the housing body 11 and the rear cover 12 are connected in a sealed manner and enclose to form an accommodating cavity 13, the circuit board assembly 20 is provided in the accommodating cavity 13, the thermally conductive liquid fills the accommodating cavity 13 and wraps the circuit board assembly 20, the housing body 11 includes a front end wall 111 disposed opposite to the rear cover 12, the first guide connector 30 is mounted on the front end wall 111 and is connected to the front end wall 111 in a sealed manner, the second guide connector 40 is mounted on the rear cover 12 and is connected to the rear cover 12 in a sealed manner, and both the first guide connector 30 and the second guide connector 40 are electrically connected to the circuit board assembly 20.

It may be understood that if two components are connected in a sealed manner, it indicates that there is no gap between the two components after the two components are connected.

It should be noted that when the power adapter 100 is in operation, the circuit board assembly 20 generates heat. A related technology implements even heat distribution in the following three manners. In a first manner, heat generated by the circuit board assembly is dissipated from a high-temperature area to a low-temperature area through air inside the power adapter, so that an even heat distribution effect is achieved inside the power adapter. However, in such manner, a heat dissipation speed is low, and a local temperature is excessively high. Therefore, high-temperature overload protection of components of the circuit board assembly is caused and the components stop operating. In a second manner, a potting adhesive is injected into the power adapter, and is used in place of air as a medium for transferring heat, so that an even heat distribution effect is achieved inside the power adapter. However, the injected potting adhesive can affect electromagnetic compatibility of the components of the circuit board assembly. In a third manner, a thermally conductive white adhesive is applied around the components generating a high temperature, of the circuit board assembly, to achieve fastening and thermal conduction effects, increase a heat dissipation area, and transfer heat, so that the components achieve an even heat distribution effect. However, a curing time of the white adhesive is long, it is difficult to control a dispensing range, and the components are easily polluted.

In view of this, the housing body 11 and the rear cover 12 enclose to form the accommodating cavity 13, the housing body 11 and the rear cover 12 are connected in a sealed manner, the thermally conductive liquid can fill the accommodating cavity 13 and wrap the circuit board assembly 20, and both the first guide connector 30 and the second guide connector 40 are connected to the housing 10 in a sealed manner to ensure that the thermally conductive liquid does not leak. In this way, heat emitted by the circuit board assembly 20 during operation may be quickly transferred from a high-temperature side to a low-temperature side through the thermally conductive liquid to implement even heat distribution, thereby improving heat dissipation efficiency of the power adapter 100. Compared with the manner of injecting an adhesive into the power adapter or the manner of applying the thermally conductive white adhesive around the components generating a high temperature, the embodiments may not affect electric performance of the circuit board assembly 20, ensuring a heat dissipation effect of the power adapter 100 with a high power and a small size. Therefore, the size of the power adapter 100 may be as small as possible when performance permits, thereby improving user experience.

In this embodiment, the thermally conductive liquid is an insulation liquid with a strong heat absorption capability, and presents an excellent thermally conductive effect without affecting electrical performance of the circuit board assembly 20, so that a heat dissipation effect of the power adapter 100 is improved. The thermally conductive liquid may be an oil liquid, for example, lubricating oil for a speed reducer.

In this embodiment, the power adapter 100 includes a first sealing kit 50, where the first sealing kit 50 is disposed between the rear cover 12 and the housing body 11 to seal the accommodating cavity 13, that is, the housing body 11 and the rear cover 12 are connected in a sealed manner by the first sealing kit 50. In another embodiment, another material may be used for sealed connection between the housing body 11 and the rear cover 12.

In this embodiment, the housing body 11 and the rear cover 12 may be connected through ultrasonic welding. The first sealing kit 50 is compressed during ultrasonic welding for connection between the housing body 11 and the rear cover 12, so that the first sealing kit 50 fills a gap between the housing body 11 and the rear cover 12, thereby effectively improving airtightness of the accommodating cavity 13. In another embodiment, the housing body 11 and the rear cover 12 may be connected in another manner. This is not limited.

In this embodiment, the first sealing kit 50 may be a sealing ring. It may be understood that it is easier to fit a sealing ring between the housing body 11 and the rear cover 12 than another sealing material. In another embodiment, the first sealing kit 50 may be another sealing material such as a sealing adhesive.

Figure 4:
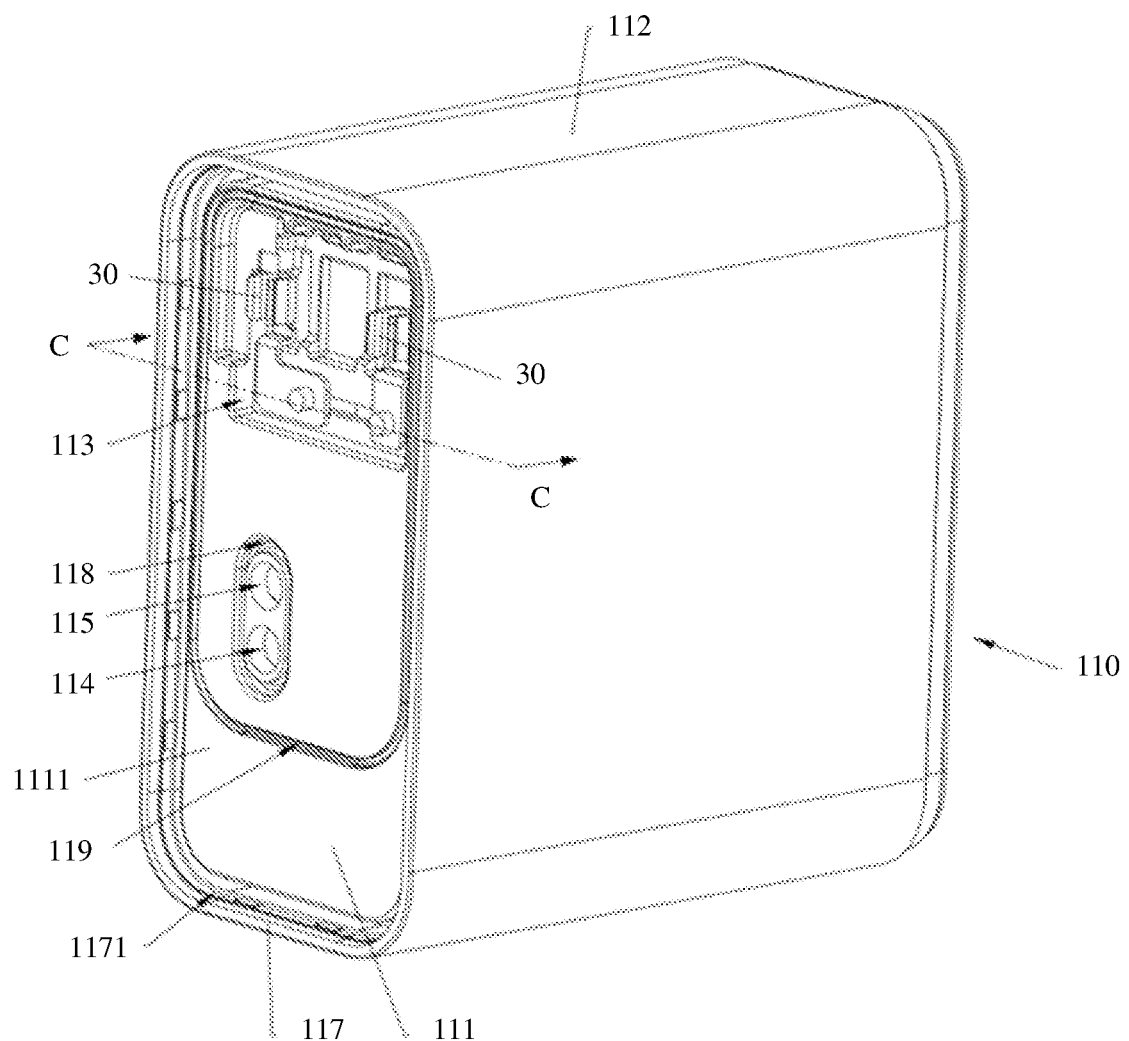
FIG. 4 is a schematic diagram of a structure of a housing body and a first guide connector in the structure shown in FIG. 2.

FIG. 4 is a schematic diagram of a structure of the housing body 11 and the first guide connector 30 in the structure shown in FIG. 2.

In this embodiment, the housing body 11 is cuboid. The housing body 11 further includes a peripheral side wall 112 connected to and disposed around the periphery of the front end wall 111, and an opening 110 is provided on a side that is of the peripheral side wall 112 and that faces away from the front end wall 111. One end that is of the peripheral side wall 112 and that is far away from the front end wall 111 is fastened to the rear cover 12. The front end wall 111, the peripheral side wall 112, and the rear cover 12 jointly enclose to form the accommodating cavity 13. In another embodiment, the housing body 11 may alternatively be cylindrical, cubic, or the like.

The front end wall 111 includes a first surface 1111 and a second surface 1112 disposed opposite to each other, where the first surface 1111 faces away from the accommodating cavity 13, and the second surface 1112 faces toward the accommodating cavity 13. The first surface 1111 is provided with a mounting groove 113, and the first guide connector 30 is mounted in the mounting groove 113. It may be understood that when the first guide connector 30 is mounted in the mounting groove 113, the first guide connector 30 and the front end wall 111 have overlapping portions in a thickness direction of the front end wall 111. Such manner can miniaturize the power adapter 100 in the thickness direction of the front end wall 111 compared with a manner of directly mounting the first guide connector 30 on the first surface 1111. In another embodiment, the first surface 1111 may not be provided with a mounting groove, and the first guide connector 30 may be directly mounted on the first surface 1111.

In this embodiment, the front end wall 111 is provided with a liquid injection hole 114, where the liquid injection hole 114 penetrates through the front end wall 111 and is connected to the accommodating cavity 13, and the liquid injection hole 114 and the mounting groove 113 are spaced apart. The thermally conductive liquid is filled into the accommodating cavity 13 through the liquid injection hole 114. In this embodiment, the liquid injection hole 114 is provided in the front end wall 111, so that during assembly of the power adapter 100, the circuit board assembly 20 may be fastened inside the housing body 11, then the rear cover 12 is fastened to the housing body 11 and sealed with the housing body 11, and finally, the thermally conductive liquid is filled into the accommodating cavity 13 through the liquid injection hole 114. Compared with a manner of filling the thermally conductive liquid into the accommodating cavity 13 before the rear cover 12 is fastened to the housing body 11, the operation in this embodiment is more convenient, and the thermally conductive liquid can be more fully filled into the accommodating cavity 13, thereby achieving a better heat dissipation effect. In another embodiment, the front end wall 111 may not be provided with a liquid injection hole, and the thermally conductive liquid is filled into the accommodating cavity 13 before the rear cover 12 is fastened to the housing body 11.

For example, there is one liquid injection hole 114 in this embodiment, and the liquid injection hole 114 is circular. In another embodiment, there may be a plurality of liquid injection holes 114, which may be in a same shape or in different shapes. The liquid injection hole 114 may be circular, star-shaped, square, or irregular in shape.

In this embodiment, the power adapter 100 further includes an exhaust hole 115, and the exhaust hole 115 is provided formed in the front end wall 111 and is connected to the accommodating cavity 13. The exhaust hole 115 is provided adjacent to the liquid injection hole 114. According to this embodiment, the exhaust hole 115 is provided, so that when the thermally conductive liquid is filled through the liquid injection hole 114 into the accommodating cavity 13, air in the accommodating cavity 13 may be discharged from the exhaust hole 115 in time. In this way, a speed of filling the thermally conductive liquid into the accommodating cavity 13 is not hindered, efficient filling of the thermally conductive liquid is implemented, and manufacturing efficiency of a product is improved. In this embodiment, the exhaust hole 115 and the liquid injection hole 114 have a same diameter, to ensure efficient filling of the thermally conductive liquid.

In an implementation scenario of another embodiment, the power adapter 100 may not include an exhaust hole. In another implementation scenario of another embodiment, the exhaust hole 115 may alternatively be disposed at the edge of the liquid injection hole 114 and is connected to the liquid injection hole 114. In still another implementation scenario of another embodiment, the exhaust hole 115 and the liquid injection hole 114 may have different diameters.

For example, there is one exhaust hole 115 in this embodiment, and the exhaust hole 115 is circular. In another embodiment, there may be a plurality of exhaust holes 115, which may be in a same shape or in different shapes. The exhaust hole 115 may be circular, star-shaped, square, or irregular in shape.

As shown in FIG. 2 and FIG. 4, in this embodiment, the power adapter 100 further includes sealing caps 116 for respectively sealing the liquid injection hole 114 and the exhaust hole 115. There may be two sealing caps 116, one of which is fastened to the liquid injection hole 114 to seal the liquid injection hole 114, and the other one is fastened to the exhaust hole 115 to seal the exhaust hole 115. This prevents the thermally conductive liquid filled into the accommodating cavity 13 from overflowing from the liquid injection hole 114 and the exhaust hole 115 and ensures airtightness of the accommodating cavity 13.

In an implementation scenario of another embodiment, a quantity of sealing caps 116 is not limited to two, and the quantity of sealing caps 116 corresponds to a total quantity of exhaust holes 115 and liquid injection holes 114. In another implementation scenario of another embodiment, the power adapter 100 may not include a sealing cap, and a sealing material may be used to seal the liquid injection hole 114 and the exhaust hole 115 after the thermally conductive liquid is filled into the accommodating cavity 13. In still another implementation scenario of another embodiment, the first surface 1111 may further be provided with a fixed structure to limit positions of the sealing caps 116, to prevent the sealing caps 116 from loosening from the liquid injection hole 114 or the exhaust hole 115.

Figure 5:
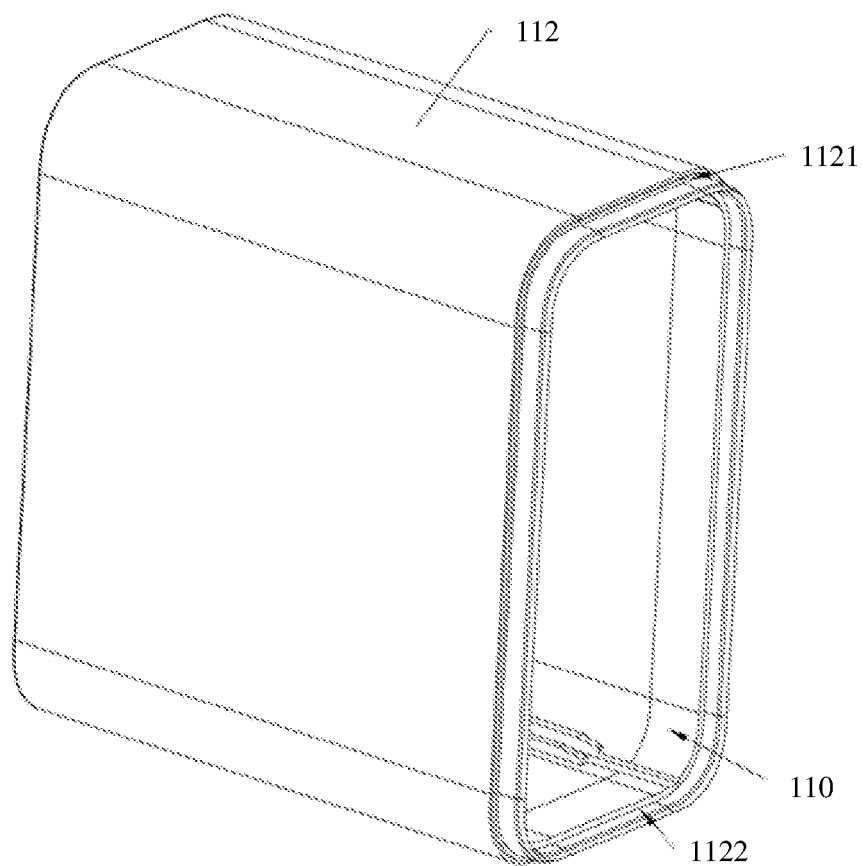
FIG. 5 is a schematic diagram of the structure shown in FIG. 4 from another angle.

FIG. 5 is a schematic diagram of the structure shown in FIG. 4 from another angle.

In this embodiment, the peripheral side wall 112 includes an end portion that is far away from the front end wall 111, and an outer side of the end portion is provided with a fitting groove 1121, where the fitting groove 1121 is configured to fit the rear cover 12. On the one hand, the fitting groove 1121 is configured to accommodate a portion that is of the rear cover 12 and that is connected to the peripheral side wall 112, to perform a position limiting effect on the rear cover 12, so that the rear cover 12 is stably fastened to the peripheral side wall 112. On the other hand, when the rear cover 12 is mounted on the peripheral side wall 112, the fitting groove 1121 facilitates quick matching between the rear cover 12 and the peripheral side wall 112, so that the rear cover 12 is quickly mounted on the peripheral side wall 112. In another embodiment, the outer side of the end portion may not be provided with a fitting groove, and the end portion is directly fixedly connected to the rear cover 12.

An inner side of the end portion is provided with an abutting groove 1122, and the abutting groove 1122 is configured to accommodate the first sealing kit 50 in cooperation with the rear cover 12, to make the first sealing kit 50 be located between the abutting groove 1122 and the rear cover 12 and stably located between the peripheral side wall 112 and the rear cover 12, thereby ensuring airtightness of the accommodating cavity 13. In another embodiment, the inner side of the end portion may not be provided with an abutting groove, and the first sealing kit 50 may be directly fastened between the end portion and the rear cover 12.

Figure 6:
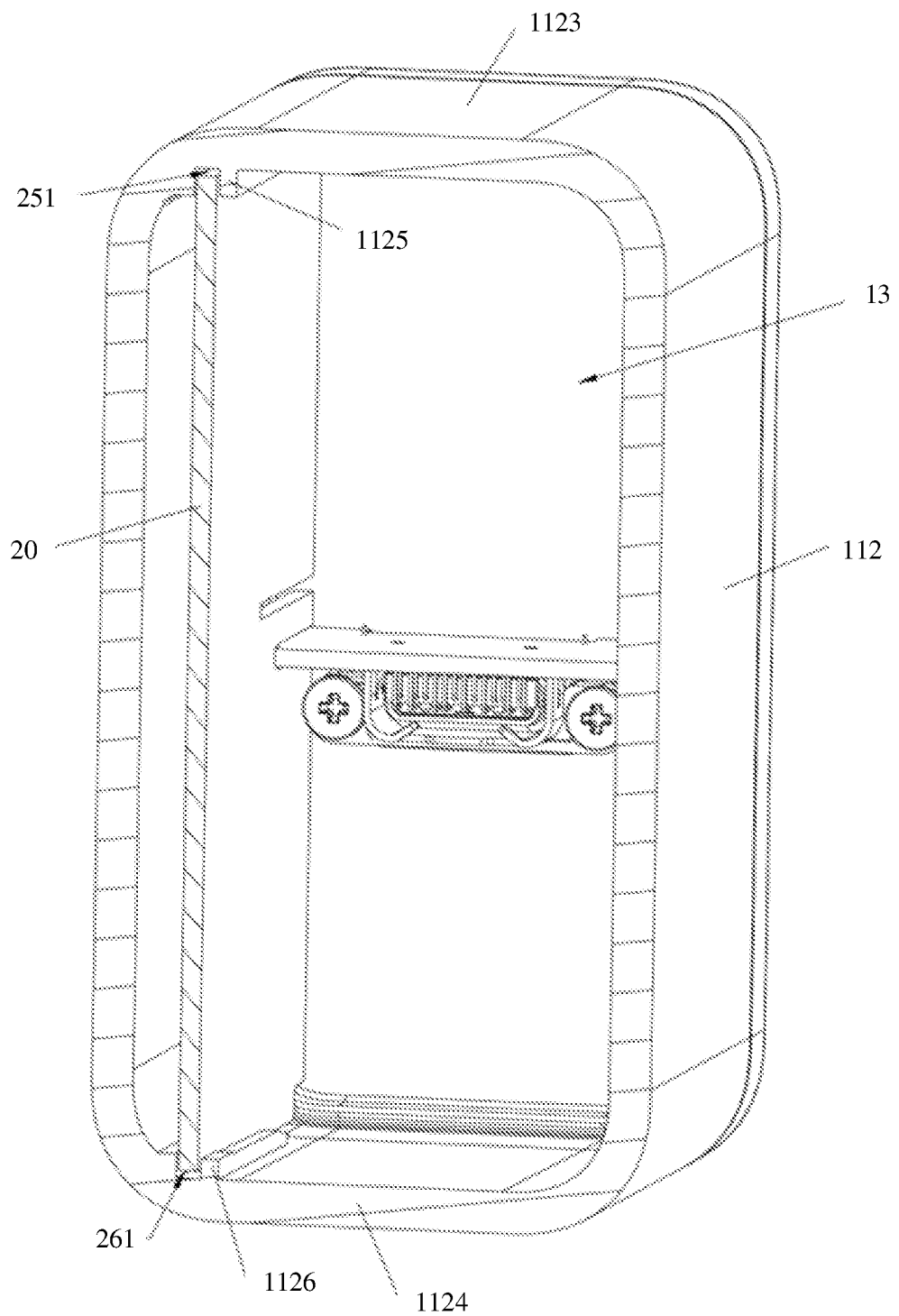
FIG. 6 is a diagram of a cross-sectional structure, in direction B-B, of the structure shown in FIG. 1.

FIG. 6 is a diagram of a cross-sectional structure, in direction B-B, of the structure shown in FIG. 1.

The peripheral side wall 112 includes a first side wall 1123 and a second side wall 1124 disposed oppositely. A first fastening portion 1125 and a second fastening portion 1126 are respectively provided on surfaces, of the first side wall 1123 and the second side wall 1124, facing toward the accommodating cavity 13. The first fastening portion 1125 and the second fastening portion 1126 are disposed oppositely. One end of the circuit board assembly 20 is fastened to the first fastening portion 1125, and the other end is fastened to the second fastening portion 1126, to stably fasten the circuit board assembly 20 inside the housing body 11. In another embodiment, the circuit board assembly 20 may alternatively be directly fastened on the peripheral side wall 112.

In this embodiment, the first fastening portion 1125 is provided with a first slot 251, and the second fastening portion 1126 is provided with a second slot 261, so that one end of the circuit board assembly 20 may be inserted into the first slot 251, and the other end may be inserted into the second slot 261. In this way, the circuit board assembly 20 can be securely fastened inside the housing body 11, and an overall strength of the power adapter 100 can be increased. In addition, compared with other fastening manners, the manner of fastening the circuit board assembly 20 by inserting the circuit board assembly 20 into the slots is simpler and easy for assembly, thereby effectively improving manufacturing efficiency.

In an implementation scenario of another embodiment, the first side wall 1123 and the second side wall 1124 may not be provided with fastening portions, and the first slot 251 and the second slot 261 may be respectively provided on the first side wall 1123 and the second side wall 1124. Such arrangement facilitates miniaturization of the power adapter 100. In another implementation scenario of another embodiment, the circuit board assembly 20 may be fastened inside the housing body 11 in another manner. This is not limited.

Figure 7:
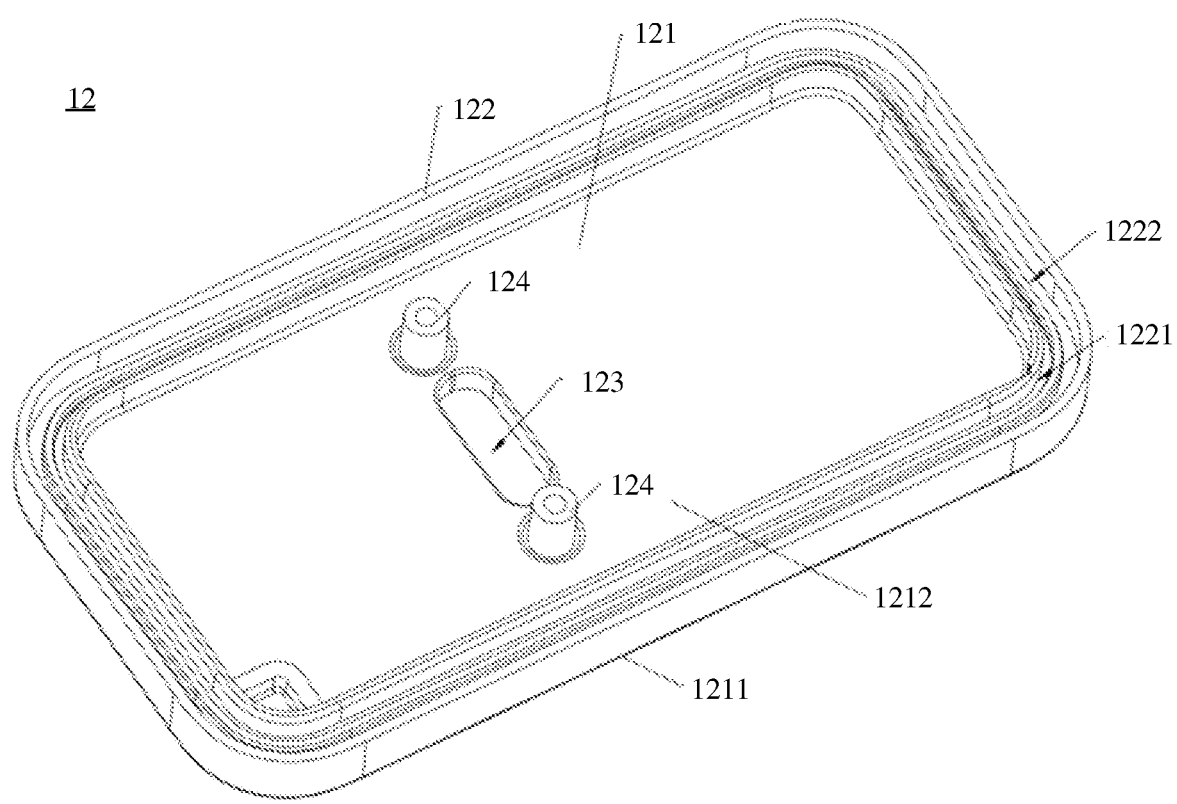
FIG. 7 is a schematic diagram of a structure of a rear cover in the structure shown in FIG. 2.

FIG. 7 is a schematic diagram of a structure of the rear cover 12 in the structure shown in FIG. 2.

The rear cover 12 may include a plate body 121 and a connecting portion 122. The plate body 121 includes a first surface 1211 and a second surface 1212 that are disposed oppositely, and the connecting portion 122 is disposed around the periphery of the second surface 1212. The connecting portion 122 is configured to fit the housing body 11, to implement a fixed connection between the rear cover 12 and the housing body 11. In another embodiment, the rear cover 12 may include only the plate body 121, but not include the connecting portion, and the plate body 121 may be directly fastened to the housing body 11.

The rear cover 12 is provided with an insertion hole 123, the insertion hole 123 penetrates through two opposite surfaces of the plate body 121, and the second guide connector 40 is fastened to the insertion hole 123. The second surface 1112 is further provided with two screw posts 124, where the two screw posts 124 are respectively provided on two opposite sides of the insertion hole 123. The screw posts 124 are configured to fit the second guide connector 40 so that the second guide connector 40 is fastened to the insertion hole 123. In another embodiment, a quantity of screw posts 124 may be any quantity other than two. The second surface 1112 may not be provided with a screw post, and the second guide connector 40 may be fastened to the insertion hole 123 by using another fastening structure.

In this embodiment, as shown in FIG. 3 and FIG. 7, a first groove 1221 and a second groove 1222 are provided at spacings on a surface that is of the connecting portion 122 and that is far away from the plate body 121, where the first groove 1221 is disposed around the middle of the plate body 121, and the second groove 1222 is disposed around the first groove 1221. The first groove 1221 is configured to accommodate the first sealing kit 50, so that a position of one end of the first sealing kit 50 is limited to the first groove 1221, and a position of the other end is limited to the abutting groove 1122 of the peripheral side wall 112. The first groove 1221 and the abutting groove 1122 jointly fasten the first sealing kit 50, so that the first sealing kit 50 is stably fastened between the housing body 11 and the rear cover 12, thereby ensuring airtightness of the accommodating cavity 13. The second groove 1222 is configured to fit the end portion of the peripheral side wall 112, and the end portion of the peripheral side wall 112 is accommodated in the second groove 1222, thereby ensuring stability of connection between the housing body 11 and the rear cover 12. In another embodiment, the connecting portion 122 may not be provided with the first groove 1221 and/or the second groove 1222.

In some embodiments, an adhesive is further applied between the second groove 1222 and an edge wall of the peripheral side wall 112, and the adhesive is used to seal a gap between the second groove 1222 and the peripheral side wall 112, to increase airtightness of the accommodating cavity 13. It may be understood that, during fastening the rear cover 12 to the housing body 11, the first sealing kit 50 may be first mounted in the first groove 1221, then the adhesive is applied inside the second groove 1222, and the rear cover 12 is mounted on the peripheral side wall 112 and is fastened to the peripheral side wall 112 through ultrasonic welding. It may be understood that, in this embodiment, a first layer of sealing is implemented between the rear cover 12 and the housing body 11 by using the first sealing kit 50, and a second layer of sealing is implemented by applying an adhesive in the second groove 1222, so that airtightness between the rear cover 12 and the housing body 11 is enhanced through several layers of sealing.

Figure 8:
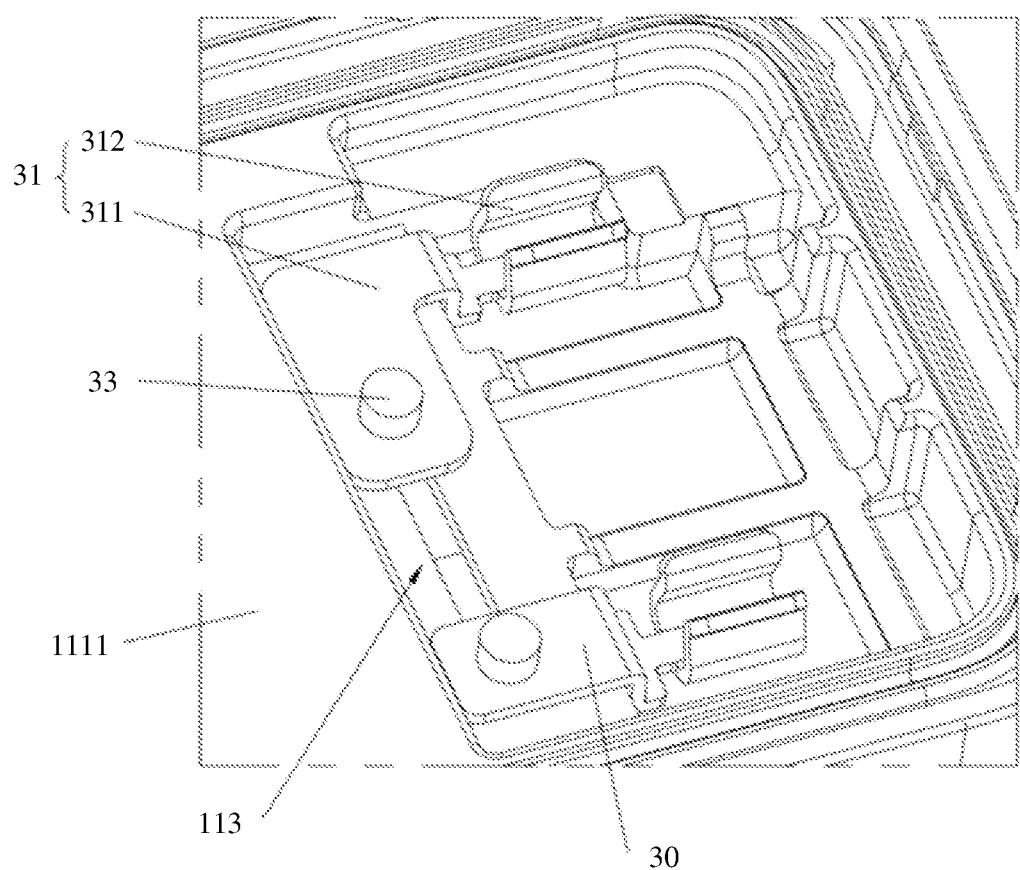
FIG. 8 is a locally enlarged schematic diagram of the structure shown in FIG. 4.
Figure 9:
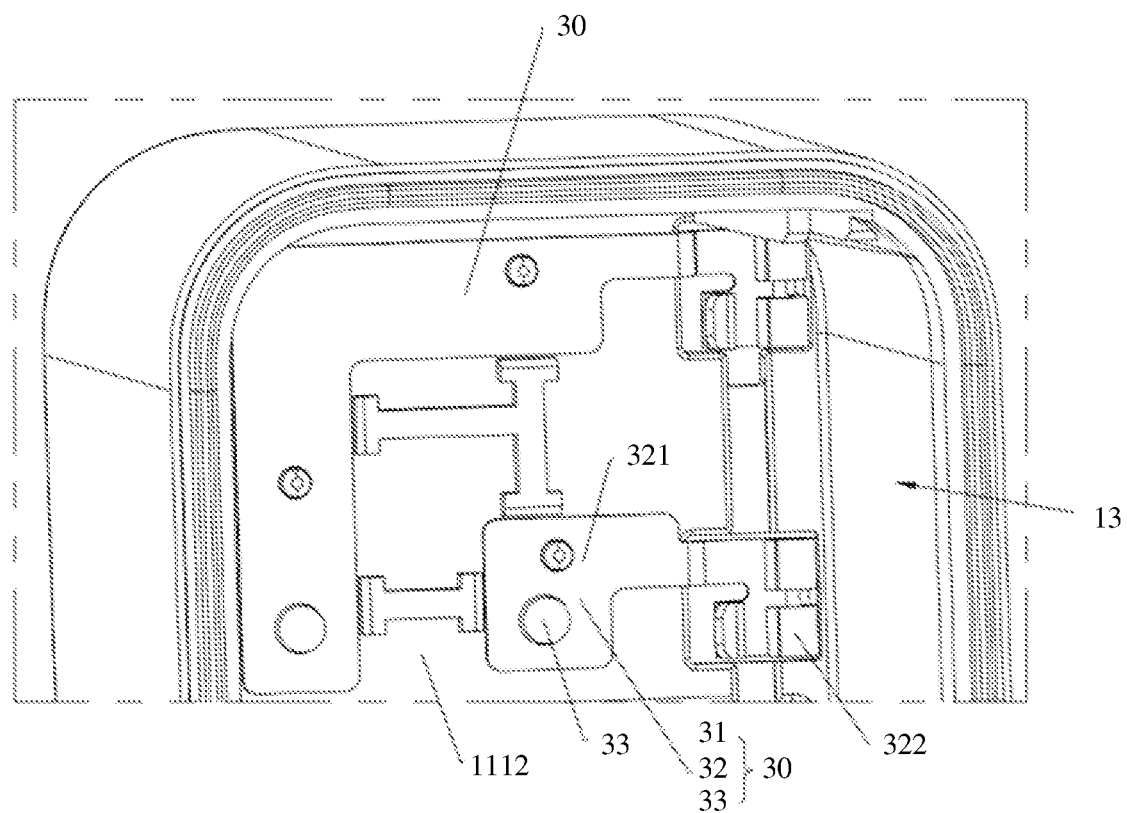
FIG. 9 is a schematic diagram of the structure shown in FIG. 5 from another angle.
Figure 10:
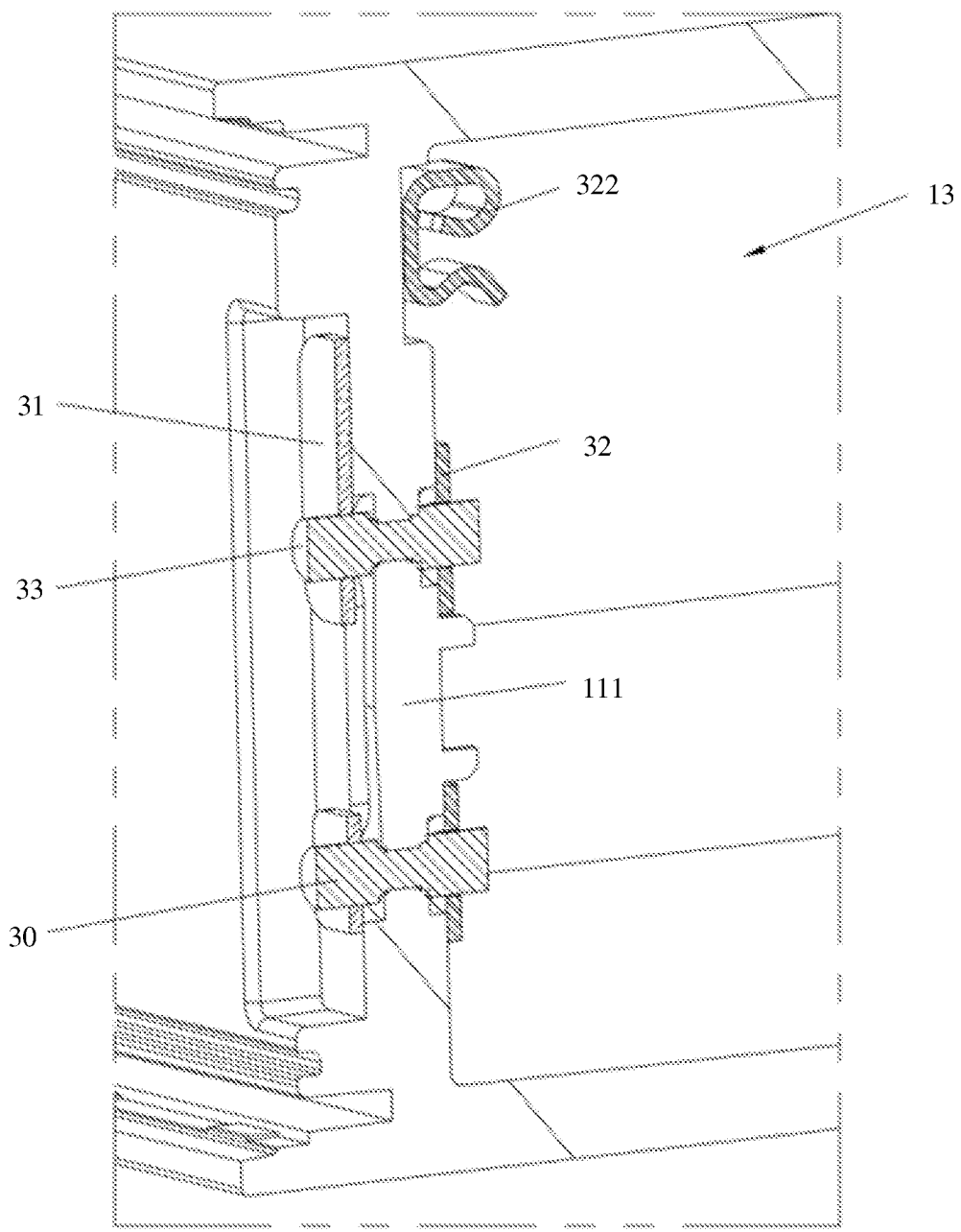
FIG. 10 is a schematic diagram of a cross-sectional structure, in direction C-C, of the structure shown in FIG. 4.

FIG. 8 is a locally enlarged schematic diagram of the structure shown in FIG. 4. FIG. 9 is a schematic diagram of the structure shown in FIG. 5 from another angle. FIG. 10 is a schematic diagram of a cross-sectional structure in direction C-C of the structure shown in FIG. 4.

The first guide connector 30 includes a first connecting portion 31, a second connecting portion 32, and an adapting portion 33. The first connecting portion 31 is fastened in the mounting groove 113 on the first surface 1111, and the second connecting portion 32 is fastened on the second surface 1112 and electrically connected to the circuit board assembly 20. The adapting portion 33 penetrates through the front end wall 111 and is electrically connected to each of the first connecting portion 31 and the second connecting portion 32, and the adapting portion 33 is connected to the front end wall 111 in a sealed manner to ensure airtightness of the accommodating cavity 13. In this embodiment, there are two first guide connectors 30, and the two first guide connectors 30 are spaced apart. In another embodiment, there may be one or more first guide connectors 30.

In this embodiment, the adapting portion 33 is fastened on the front end wall 111 through insert molding. Fastening the adapting portion 33 on the front end wall 111 through insert molding, on one hand, can ensure a sealing effect between the adapting portion 33 and the front end wall 111, and on the other hand, can improve manufacturing efficiency of a product by omitting a step of mounting the adapting portion 33 on the front end wall 111. In another embodiment, the adapting portion 33 may alternatively be mounted on the front end wall 111, and a gap between the adapting portion 33 and the front end wall 111 may be sealed by using a sealing material.

In this embodiment, the first connecting portion 31 includes a first connecting member 311 and a first pin leaf spring 312 that are connected. The first connecting member 311 is electrically connected to the adapting portion 33, and the first connecting member 311 and the adapting portion 33 may be fastened by riveting. The first pin leaf spring 312 includes two springs that are spaced apart and electrically connected. When the first pin leaf spring 312 is electrically connected to another component, the component is fitted between the two springs, and the two springs clamp the component to implement electrical connection between the first pin leaf spring 312 and the component.

The second connecting portion 32 includes a second connecting member 321 and a second pin leaf spring 322 that are connected. The second connecting member 321 is electrically connected to the adapting portion 33, and the second connecting member 321 and the adapting portion 33 may be fastened by riveting. The second pin leaf spring 322 is electrically connected to the circuit board assembly 20. A structure of the second pin leaf spring 322 may be the same as or similar to a structure of the first pin leaf spring 312. A connecting end, of the circuit board assembly 20, electrically connected to the second pin leaf spring 322 may be directly fitted between the two springs of the second pin leaf spring 322 to implement electrical connection between the circuit board assembly 20 and the first guide connector 30. The circuit board assembly 20 and the first guide connector 30 are electrically connected in a clamping manner, which is simpler, more convenient, and faster than another electrical connection manner, thereby improving manufacturing efficiency of a product.

In another embodiment, the first connecting portion 31 and the second connecting portion 32 may not include a pin leaf spring, and the first connecting portion 31 and the second connecting portion 32 may implement electrical connection to a corresponding device in another connection manner.

Figure 11:
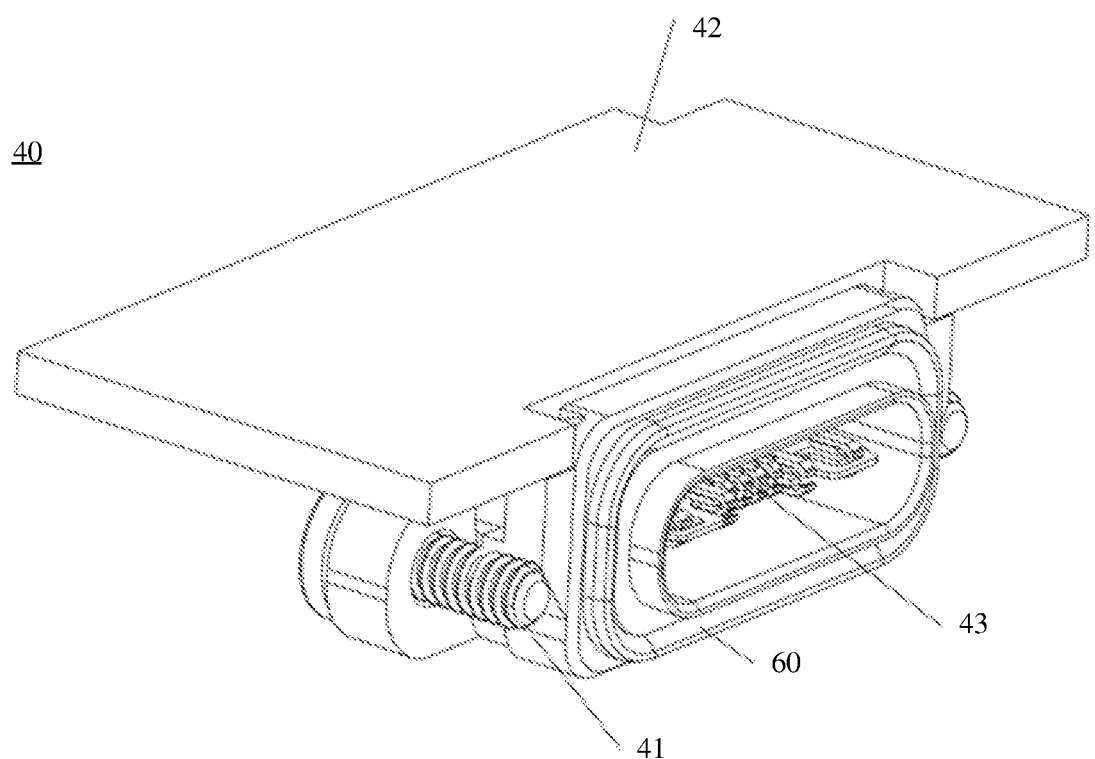
FIG. 11 is a schematic diagram of a structure of a second guide connector in the structure shown in FIG. 2.
Figure 12:
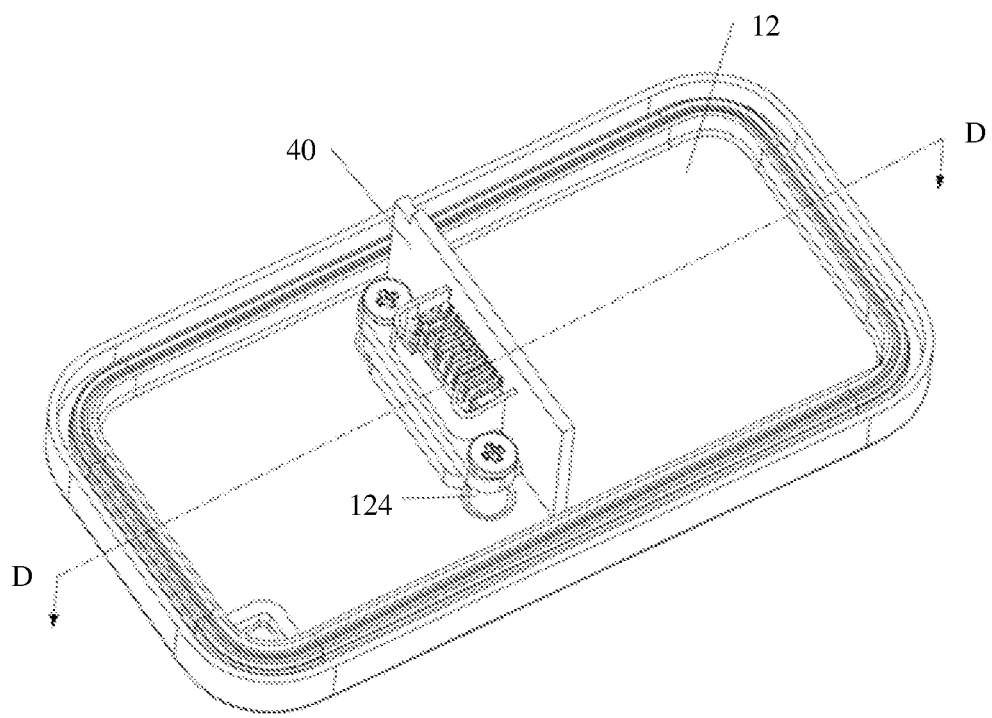
FIG. 12 is a schematic diagram of a structure of a second guide connector, shown in FIG. 11, being fastened to a rear cover.
Figure 13:
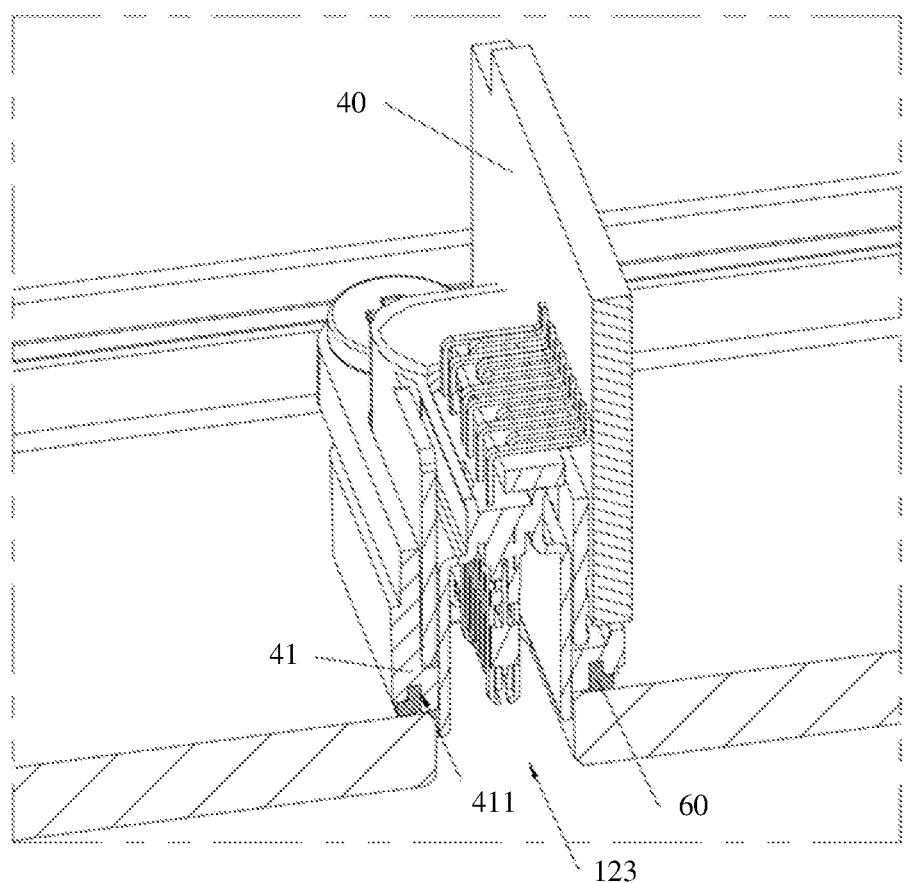
FIG. 13 is a schematic diagram of a cross-sectional structure, in direction D-D, of the structure shown in FIG. 12.

FIG. 11 is a schematic diagram of a structure of the second guide connector 40 in the structure shown in FIG. 2. FIG. 12 is a schematic diagram of a structure of the second guide connector 40, shown in FIG. 11, being fastened to the rear cover 12. FIG. 13 is a schematic diagram of a cross-sectional structure, in direction D-D, of the structure shown in FIG. 12.

In this embodiment, the second guide connector 40 includes a first mounting member 41, a second mounting member 42, and an output terminal 43. One end of the output terminal 43 extends through the middle of the first mounting member 41, the other end of the output terminal 43 is electrically connected to the second mounting member 42, and the second mounting member 42 is electrically connected to the circuit board assembly 20.

A sealing groove 411 is provided on an outer edge of the first mounting member 41, and the sealing groove 411 is disposed around the output terminal 43. The power adapter 100 further includes a third sealing kit 60, where the third sealing kit 60 is disposed in the sealing groove 411. When the second guide connector 40 is fastened to the rear cover 12, the second guide connector 40 is screwed by using the screw posts 124 of the rear cover 12. The first mounting member 41 abuts against the plate body 121 of the rear cover 12 to compress the third sealing kit 60, and the output terminal 43 is disposed in the insertion hole 123 of the rear cover 12, so that the third sealing kit 60 seals a gap between the second guide connector 40 and a hole wall of the insertion hole 123. This prevents the thermally conductive liquid in the accommodating cavity 13 from leaking out through the gap between the second guide connector 40 and the insertion hole 123 and ensures airtightness of the accommodating cavity 13. In addition, the sealing groove 411 ensures that the third sealing kit 60 is stably fastened between the first mounting member 41 and the rear cover 12.

It may be understood that the second guide connector 40 is an output port of the power adapter 100, to implement electrical connection between the circuit board assembly 20 and a to-be-charged device. The second guide connector 40 includes one or more USB interfaces. In some implementations, the power adapter 100 is configured to charge a plurality of devices.

In another embodiment, the first mounting member 41 may not be provided with a sealing groove, and the third sealing kit 60 directly abuts against the first mounting member 41 and the rear cover 12.

Figure 14:
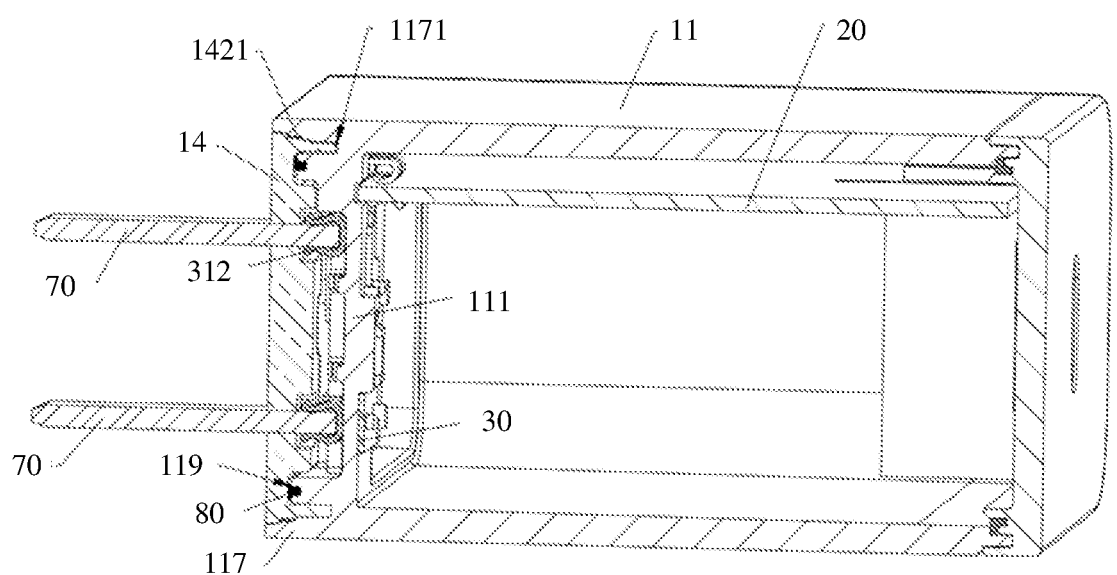
FIG. 14 is a schematic diagram of a cross-sectional structure, in E-E direction, of a power adapter shown in FIG. 1.

FIG. 14 is a schematic diagram of a cross-sectional structure, in E-E direction, of the power adapter 100 shown in FIG. 1.

The housing 10 further includes a front cover 14, and the front cover 14 is fastened to a side, of the housing body 11, having the front end wall 111, and covers the front end wall 111. The front cover 14 is provided with pins 70, and the pins 70 are made of conductive metal. The pins 70 penetrate through two opposite surfaces of the front cover 14 and are connected to the first guide connector 30 in a clamping manner. The pins 70 are input ports of the power adapter 100 and are configured to connect to an external power supply.

The pins 70 may need to be plugged and unplugged in a process of connecting to the external power supply, and a gap occurs between the pins 70 and the front cover 14 under a force during plugging and unplugging of the pins 70. If the pins 70 are directly fastened on the front end wall 111 of the housing body 11, a gap occurs between the pins 70 and the front end wall 111 during plugging and unplugging of the pins 70, and the thermally conductive liquid in the accommodating cavity 13 can leak out through the gap. To avoid leakage of the thermally conductive liquid, the first guide connector 30 is provided on the front end wall 111, and the pins 70 are connected to the first guide connector 30, that is, the pins 70 are separated from the housing body 11, so that leakage of the heat conductive liquid can be avoided even if a gap occurs between the pins 70 and the front cover 14 during plugging and unplugging of the pins 70.

In a scenario of another embodiment, the housing 10 may not include a front cover and a pin, and the first guide connector 30 is the pin 70. Alternatively, the first connecting portion 31 of the first guide connector 30 is the pin 70.

Figure 15:
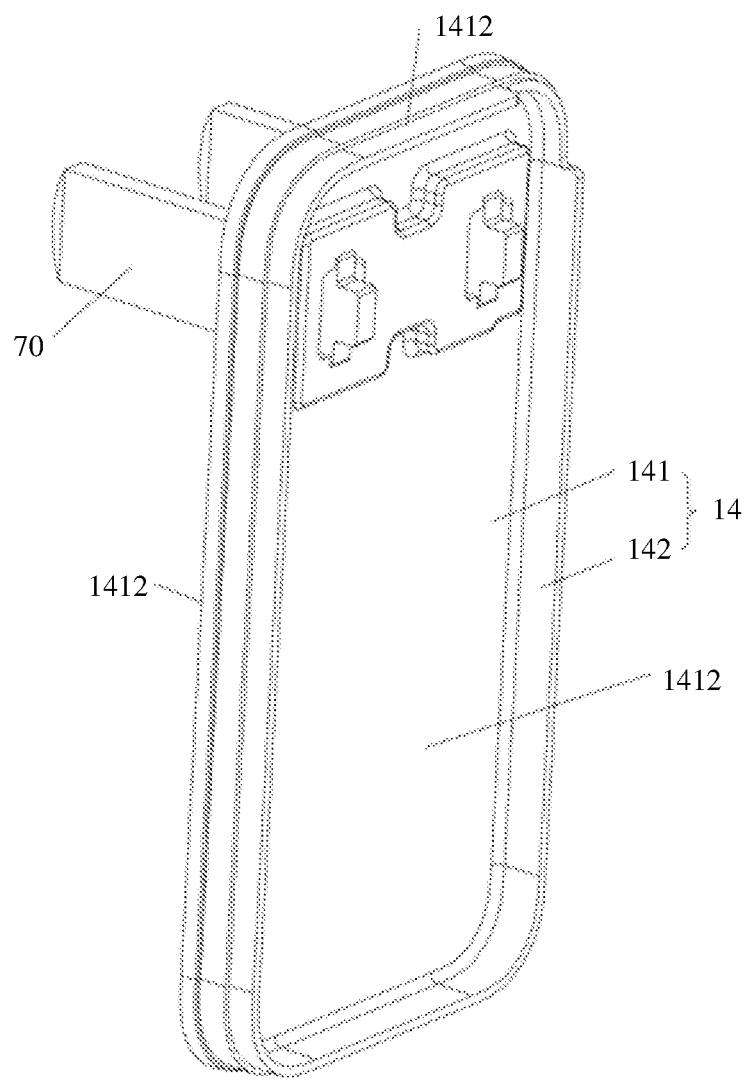
FIG. 15 is a schematic diagram of structure of a front cover and pins according to an embodiment.

FIG. 15 is a schematic diagram of structure of a front cover and pins according to an embodiment.

The front cover 14 includes a cover body 141 and a connecting body 142. The cover body 141 includes a first surface 1411 and a second surface 1412 that are disposed oppositely, and the connecting body 142 is disposed around the periphery of the second surface 1412. The pin 70 is fastened to the cover body 141 of the front cover 14, penetrates through the opposite two surfaces (the first surface 1411 and the second surface 1412) of the cover body 141 of the front cover 14, and is electrically connected to the first guide connector 30. It may be understood that, one end of the pin 70 extends out of the first surface 1411 to be electrically connected to the external power supply, and the other end of the pin 70 extends out of the second surface 1412 to be electrically connected to the first guide connector 30. In another embodiment, the front cover 14 may include only the cover body 141, but not include the connecting body, and the cover body 141 may be directly fastened to the front end wall 111.

In this embodiment, there are two pins 70, and the two pins 70 are connected to respective first pin leaf springs 312 of corresponding first guide connectors 30, to implement electrical connection between the pins 70 and the circuit board assembly 20. In another embodiment, there may be another quantity of pins 70. The quantity of the pins 70 may correspond to the quantity of the first guide connectors 30. Positions, shapes, and sizes of the pins 70 may be flexibly set depending on a requirement. In another implementation, the input port may alternatively be provided in another form, for example, a plug with a connecting cable.

As shown in FIG. 4, FIG. 14, and FIG. 15, in this embodiment, a stepped structure 1421 is provided on an outer surface of the connecting body 142. The housing body 11 also includes a connecting portion 117, and the connecting portion 117 is disposed around the edge of the front end wall 111. A stepped groove 1171 is provided on an inner side of the connecting portion 117, and the stepped structure 1421 of the front cover 14 is fastened in the stepped groove 1171, so that the front cover 14 and the front end wall 111 are fastened together. In this embodiment, the stepped groove 1171 is configured to accommodate the front cover 14, with a position limiting effect on the front cover 14, so that the front cover 14 is stably fastened to the housing body 11.

In this embodiment, the stepped groove 1171 has two steps, to ensure that the front cover 14 is more stably fastened in the stepped groove 1171. In an implementation scenario of another embodiment, the stepped groove 1171 may further have one step or a plurality of steps. In another implementation scenario of the another embodiment, the connecting portion 117 may not be provided with the stepped groove 1171, and the front cover 14 may be directly fastened on a surface, of the connecting portion 117, far away from the front end wall 111.

The front cover 14 and the housing body 11 may be connected through ultrasonic welding. In some implementations, an adhesive may be further provided inside the stepped groove 1171 and is used to seal a gap between the stepped groove 1171 and the stepped structure 1421, to increase airtightness of the accommodating cavity 13. In another embodiment, the front cover 14 and the housing body 11 may be connected in another fastening manner.

The housing of the power adapter in this embodiment may include three parts (the front cover, the housing body, and the rear cover), and assembly of the entire machine can be realized by only two times of ultrasonic welding. In other words, an assembly process is simple and therefore manufacturing efficiency of a product is high.

The front cover 14 may cover the front end wall 111, may cover the sealing caps 116 and other structures, and may protect the sealing caps 116 and other structures. In this embodiment, surfaces that are of the sealing caps 116 and that are away from the liquid injection hole 114 or the exhaust hole 115 abut against the front cover 14. In other words, the cover body also has a position limiting effect on the sealing caps 116, to prevent the sealing caps 116 from loosening from the liquid injection hole 114 and the exhaust hole 115, and ensure airtightness of the accommodating cavity 13.

As shown in FIG. 4 and FIG. 14, the front end wall 111 further includes a groove 118, and the groove 118 is disposed, on the first surface 1111, around the liquid injection hole 114 and the exhaust hole 115. The groove 118 is configured to accommodate a sealing kit (not shown in the figures), and the sealing kit may be a sealing ring that is sandwiched between the groove 118 and the plate body 121 of the front cover 14. In this way, even if the thermally conductive liquid overflows from the liquid injection hole 114 and the exhaust hole 115, the overflowing thermally conductive liquid may not flow to another space between the front cover 14 and the front end wall 111. It may be understood that a first layer of sealing is implemented by using the sealing caps 116 to seal the liquid injection hole 114 and the exhaust hole 115, and a second layer of sealing is implemented by disposing the groove 118, disposing the sealing ring in the groove 118, and using the sealing ring to seal space around the liquid injection hole 114 and the exhaust hole 115. Airtightness of the accommodating cavity 13 is improved through several layers of sealing.

In some embodiments, as shown in FIG. 2, FIG. 4, and FIG. 14, the front end wall 111 includes a sealing groove 119, and the sealing groove 119 is disposed, on the first surface 1111, around the mounting groove 113 and the groove 118. The power adapter 100 further includes a second sealing kit 80, and the second sealing kit 80 is disposed between the sealing groove 119 and the front cover 14. It may be understood that the sealing groove 119 is configured to accommodate and fasten the second sealing kit 80, to ensure that the second sealing kit 80 is stably fastened between the front end wall 111 and the front cover 14. Through disposing the second sealing kit 80 between the sealing groove 119 and the front cover 14, a gap between the front end wall 111 and the front cover 14 is sealed, so that even if the thermally conductive liquid overflows from the mounting groove 113 and the groove 118, the thermally conductive liquid does not overflow out of the housing 10 from the gap between the front end wall 111 and the front cover 14. Sealing the gap between the front end wall 111 and the front cover 14 by using the second sealing kit 80 is a third layer of sealing. In this embodiment, airtightness of the accommodating cavity 13 is improved through several layers of sealing.

In this embodiment, the second sealing kit 80 is a sealing ring. In another embodiment, the second sealing kit 80 may be another sealing material.

In another embodiment, the front end wall 111 may include only one of the groove 118 and the sealing groove 119. Alternatively, the front end wall 111 may include neither of the groove 118 and the sealing groove 119.

The printed circuit board assembly (PCBA) 20 includes a circuit board and electronic components (which are not shown in the figure) disposed on the circuit board. In this embodiment, there is one circuit board, where one end of the circuit board is inserted into the first slot 251, and the other end is inserted into the second slot 261, to fasten the circuit board assembly 20 to the housing body 11. The circuit board may be fixedly connected to the second guide connector 40. There may be a plurality of circuit boards. The electronic components may be, for example, various chips, transformers, or rectifier circuits, and some of the electronic components are heating electronic components. The power adapter 100 generates a large amount of heat during operation (in a charging state), and the heat can be quickly transferred from a high-temperature side to a low-temperature side through the thermally conductive liquid to implement even heat distribution. This improves heat dissipation efficiency of the power adapter 100, and ensures a heat dissipation effect of the power adapter 100 with a high power and a small size, so that the size of the power adapter 100 may be as small as possible when performance permits, thereby improving user experience.

It should be noted that the embodiments and features in the embodiments may be combined if there is no conflict, and any combination of features in different embodiments also falls within their scope. In other words, the above-described embodiments may be flexibly combined based on an actual requirement.

It should be noted that all the accompanying drawings are examples and do not represent an actual size of a product. In addition, proportion relationships of sizes between the components in the accompanying drawings are not intended to limit an actual product.

The foregoing descriptions are merely some embodiments and implementations, but are not intended as limiting. Any variation or replacement readily figured out by a person skilled in the art shall fall within the scope of the embodiments.

The invention claimed is:

1. A power adapter; comprising:
a housing body, wherein the housing body has an opening;
a rear cover, wherein the rear cover is fastened to the housing body and covers the opening and the housing body and the rear cover are connected in a sealed manner and enclose to form an accommodating cavity;
a circuit board assembly, wherein the circuit board assembly is disposed in the accommodating cavity and the housing body comprises a front end wall disposed opposite to the rear cover;
a first guide connector, wherein the first guide connector is mounted on the front end wall and connected to the front end wall in a sealed manner;
a second guide connector, wherein the second guide connector is mounted on the rear cover and is connected to the rear cover in a sealed manner, and both the first guide connector and the second guide connector are electrically connected to the circuit board assembly and a thermally conductive liquid, wherein the thermally conductive liquid fills the accommodating cavity and wraps the circuit board assembly:
wherein the first guide connector further comprises:
a first connecting portion,
a second connecting portion, and
an adapting portion, the front end wall comprises a first surface and a second surface disposed opposite to each other, the second surface faces toward the accommodating cavity, the first connecting portion is fastened on the first surface, the second connecting portion is fastened on the second surface and electrically connected to the circuit board assembly, the adapting portion penetrates through the front end wall and is electrically connected to each of the first connecting portion and the second connecting portion, and the adapting portion is connected to the front end wall in a sealed manner.

2. The power adapter according to claim 1, wherein the adapting portion is fastened on the front end wall through insert molding.

3. The power adapter according to claim 1, wherein the first connecting portion is a pin.

4. The power adapter according to claim 1, further comprising: a third sealing kit, wherein the rear cover is provided with an insertion hole, the second guide connector is fastened to the insertion hole, and the second guide connector and a hole wall of the insertion hole are sealed by using the third sealing kit.

5. The power adapter according to claim 1, further comprising:
a front cover, wherein pins are disposed on the front cover, the pins penetrate through two opposite surfaces of the front cover, the front cover is fastened on the front end wall, and the pins are connected to the first guide connector.

6. The power adapter according to claim 5, wherein the front end wall further comprises:
a sealing groove disposed around the first guide connector, and the power adapter further comprises:
a second sealing kit, and the second sealing kit is disposed between the sealing groove and the front cover.

7. The power adapter according to claim 1, wherein the front end wall is provided with a liquid injection hole, through which the thermally conductive liquid is filled into the accommodating cavity.

8. The power adapter according to claim 7, further comprising:
an exhaust hole formed in the front end wall and is connected to the accommodating cavity.

9. The power adapter according to claim 7, further comprising:
a sealing cap fastened to the liquid injection hole.

10. The power adapter according to claim 9, further comprising:
a front cover fastened on the front end wall, wherein a surface that is of the sealing cap and that faces away from the liquid injection hole abuts against the front cover.

* * * * *